(12) United States Patent
Hakkesteegt et al.

(10) Patent No.: US 11,837,992 B2
(45) Date of Patent: Dec. 5, 2023

(54) INSULATION PIERCING CABLE CONNECTION SYSTEM

(71) Applicant: Nederlandse Organisatie voor toegepast-natuurwetenschappelijk onderzoek TNO, 's-Gravenhage (NL)

(72) Inventors: Hendrik Cornelis Hakkesteegt, Abbenes (NL); Stan Anton Willem Klerks, Rotterdam (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 670 days.

(21) Appl. No.: 16/652,983

(22) PCT Filed: Oct. 2, 2018

(86) PCT No.: PCT/NL2018/050654
§ 371 (c)(1),
(2) Date: Apr. 1, 2020

(87) PCT Pub. No.: WO2019/070121
PCT Pub. Date: Apr. 11, 2019

(65) Prior Publication Data
US 2020/0244218 A1    Jul. 30, 2020

(30) Foreign Application Priority Data

Oct. 2, 2017   (EP) .................................. 17194299

(51) Int. Cl.
*H02S 40/32*    (2014.01)
*H02S 40/34*    (2014.01)
*H02S 40/36*    (2014.01)
*H01L 31/02*    (2006.01)

(52) U.S. Cl.
CPC ........ *H02S 40/32* (2014.12); *H01L 31/02008* (2013.01); *H02S 40/34* (2014.12); *H02S 40/36* (2014.12)

(58) Field of Classification Search
None
See application file for complete search history.

(56) References Cited

U.S. PATENT DOCUMENTS 9,225,286 B1    12/2015   Tweedie
2010/0139945 A1   6/2010   Dargatz
(Continued)

FOREIGN PATENT DOCUMENTS

DE   10 2014 115 601 B3   1/2016
EP       2 899 867 A2     7/2015
(Continued)

OTHER PUBLICATIONS

English language translation of the abstract of JP-2002141544-A. (Year: 2002).*

(Continued)

*Primary Examiner* — Eli S Mekhlin
(74) *Attorney, Agent, or Firm* — Studebaker & Brackett PC

(57) ABSTRACT

The invention is directed to an insulation piercing cable connection system, to an insulation piercing cable and an insulation piercing connector for use in said insulation piercing cable connection system, and to a photovoltaic system.

15 Claims, 4 Drawing Sheets

(56) References Cited

U.S. PATENT DOCUMENTS

| | | | | |
|---|---|---|---|---|
| 2011/0036386 A1* | 2/2011 | Browder | ................ | H02S 40/32 |
| | | | | 136/244 |
| 2012/0329309 A1* | 12/2012 | Weaver | ................ | H01R 4/242 |
| | | | | 439/404 |
| 2013/0269746 A1* | 10/2013 | Ramsey | ................ | H02S 40/36 |
| | | | | 174/84 R |
| 2018/0287484 A1* | 10/2018 | Braginsky | ............... | H02J 3/381 |

FOREIGN PATENT DOCUMENTS

| | | |
|---|---|---|
| EP | 3 462 605 A1 | 4/2019 |
| JP | 2002141544 A * 5/2002 | ............. H02S 20/23 |

OTHER PUBLICATIONS

International Search Report issued in PCT/NL2018/050654; dated Feb. 22, 2019.

* cited by examiner

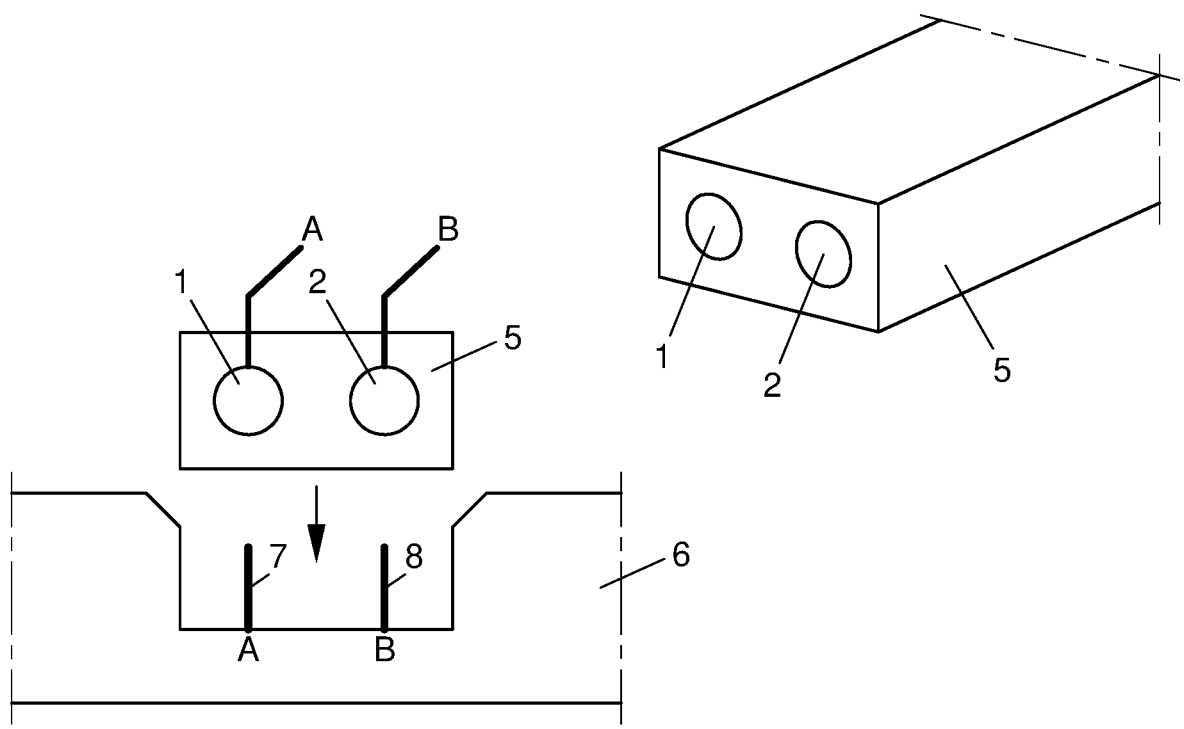
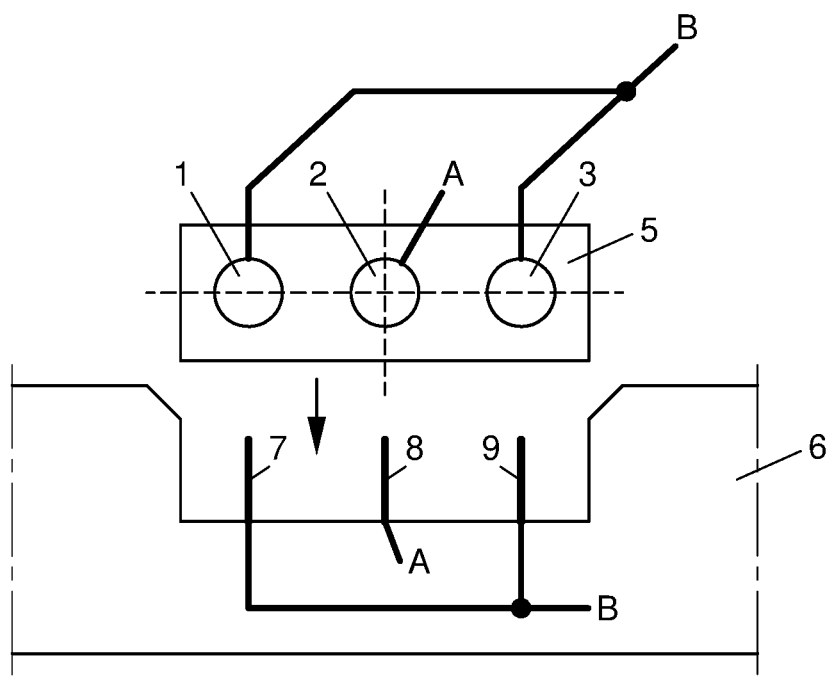
Fig. 1
Fig. 2

INSULATION PIERCING CABLE CONNECTION SYSTEM

The invention is directed to an insulation piercing cable connection system, to an insulation piercing cable and an insulation piercing connector for use in said insulation piercing cable connection system, and to a photovoltaic system.

The insulation piercing cable connection system of the invention comprises an insulation piercing cable, and an insulation piercing cable connector, wherein said insulation piercing cable comprises a flat cable having three or more conductors embedded in insulation material, wherein a cross-section of the insulation piercing cable has a perimeter with two orthogonal axes of symmetry, and wherein the arrangement of conductors in said cross-section has point symmetry, and wherein said insulation piercing cable connector comprises a cavity for receiving said insulation piercing cable, wherein said cavity comprises three or more cable piercing conductors, wherein the amount of cable piercing conductors in the insulation piercing cable connector is the same as the amount of conductors in the insulation piercing cable, and wherein said insulation piercing cable connector is compatible to be electrically connected to said insulation piercing cable by piercing the insulation of said insulation piercing cable with said cable piercing conductors.

Photovoltaic devices are well known in the art. Such devices absorb sunlight and convert it directly into useable electrical energy. A typical photovoltaic cell is a solid-state device in which a junction is formed between adjacent layers of semiconductor materials doped with specific atoms. When light energy or photons strike the semiconductor, electrons are dislodged from the valence band. These electrons, collected by the electric field at the junction, create a voltage that can be put at work in an external circuit. The basic principles that underlie this effect are well-known and understood to those in the art.

While solar power generation is a clean method of generating energy, there remains a lack of a cohesive integrated infrastructure that uses solar energy as a power source. In addition, some customers find the appearance of solar panels on roofs unappealing and unattractive.

It would be desirable if solar power generation could be integrated in trafficable surfaces such as roads, parking lots, driveways, sidewalks and the like.

In recent years, photovoltaic trafficable surfaces have emerged as a solution to increase the amount of energy harvested from the sun. A photovoltaic trafficable surface known as SolaRoad® is located in the town of Krommenie in the Netherlands. This photovoltaic trafficable surface comprises a top layer of tempered glass of about 1 cm thick with underneath crystalline silicon solar cells. The SolaRoad® system is prefabricated as a whole as 2.5 by 3.5 metre concrete modules comprising the polycrystalline silicon solar cells. These modules have to be transported to the road site and placed as such on the desired location. It is not possible to replace only part of a concrete module upon failure. This rather inflexible construction method as well as inefficient maintenance requirement results in high costs per covered surface area and produced energy unit.

The optimal electric architecture for large scale solar power (photovoltaic) system which is subjected to irregular shadowing, such as when integrated in a road surface, makes use of local DC/DC (direct current/direct current) converters with integrated Maximum Power Point Tracking (MPPT). These local converters need to be connected to a DC-bus-cable to transport the power to a central location. Cost reduction can be obtained when this cabling system can be optimised both in terms of material cost and labour.

The Dutch company NKF manufactured for a short period of time (around the year 2002) the OK5 micro inverter which did not use connectors for the connection of these micro inverters to the bus-cable (also referred to as trunk cable). For the bus cable a two conductor insulation piercing cable was used which was originally designed for outside lighting applications. This commonly available cable, with a symmetric rectangular cross-section could only be used because the micro inverter produces an alternating output voltage (AC, alternating current) which means that there is no strict rule that contact number one of the micro inverter has to be connected to conductor number one of the cable. It is allowed to twist the cable and swap the conductors, unlike cables that are used for direct current.

The OK5 micro inverter makes use of "standard" Power Line Communication (PLC) over the two conductors of the cable which requires relatively expensive electronic components which in addition reduce the energy efficiency of the system due to additional dissipation losses.

The German company Wieland Electric GmbH manufactures insulation piercing flat cable connection systems for direct current applications called Podis™ and Genesis™ which prevent incorrect connection with the cable conductors by using a flat cable wherein one lateral edge of a longitudinal cross-section of the cable has a different shape than the opposing lateral edge of the cross-section.

US-A-2011/0 036 386 discloses a fully integrated and self-contained alternating current photovoltaic solar panel device, which features an integral micro-inverter having a compression connector fitting for electrically connecting the utility grid. An insulating piercing connection is used to connect the alternating current output of a micro inverter onto a three wire bus-cable. Incorrect connection of the cable is prevented by using a cable wherein one lateral edge of a longitudinal cross-section of the cable has a flat shape, while the opposing lateral edge of the cross-section has a rounded shape.

The insulation piercing flat cable connection systems described in US-A-2011/0 036 386 and those manufactured by the German manufacturer Wieland Electric GmbH prevent that the cable can be connected 'upside down'. This way it should be guaranteed that conductor number one in the cable will be connected to connection number one in the connected device. Preventing that connections can be swapped is necessary for connecting to a direct current (DC) bus. The systems used by Wieland Electric GmbH makes use of a flat cable wherein the opposing lateral edges have different shapes. The special shape of the cross-section should make it impossible to insert the cable the wrong way around. The drawback of this is that an additional twist of the cable, for instance to reduce the stress on the connection, is not allowed. The special shape with the non-rectangular cross-section is also more expensive to manufacture.

U.S. Pat. No. 9,225,286 discloses an insulation piercing cable connection system, comprising an insulation piercing cable, or output cable, and an insulation piercing cable connector, or trunk cable. The insulation piercing cable connection system disclosed herein requires a pre-set connector orientation. There is only one possible way of connecting the system. Improper assembly is prevented by the presence of a keying feature at the bottom of a snap-in cover and a corresponding indent in the trunk cable. It is clear from FIG. 5 of U.S. Pat. No. 9,225,286 that improper assembly results in an embodiment that does not work properly.

DE-B-10 2014 115 601 discloses a junction box wherein the individual inverters at each photovoltaic modules are jointly connected.

There remains a need in the art for improved insulation piercing cable connection systems. In particular, it is desirable when an insulation piercing cable connection system can be used in combination with direct current.

BRIEF DESCRIPTION OF THE DRAWINGS

FIG. 1 depicts a conventional insulation piercing connection system with conductors 1 and 2, and a symmetric rectangular cross section of cable that can be used for AC application.

FIG. 2 depicts a schematic example of an embodiment of the invention.

Figure 3:
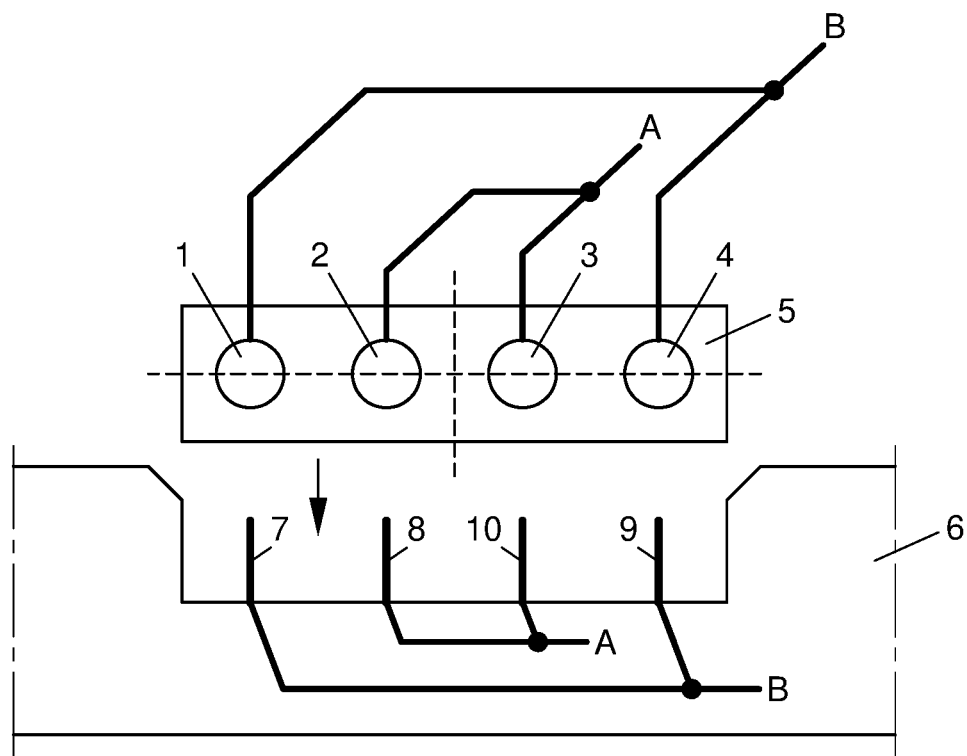
FIG. 3 depicts an insulation piercing cable with four conductors.

Objective of the invention is to address this need in the art and/or to overcome one or more drawbacks of prior art insulation piercing cable connection systems.

The inventors found that this objective can be met, at least in part, by providing a specially designed insulation piercing cable connection system.

Accordingly, in a first aspect the invention is directed to an insulation piercing cable connection system, comprising an insulation piercing cable, and an insulation piercing cable connector, wherein said insulation piercing cable comprises a flat cable having three or more conductors embedded in insulation material, wherein a cross-section of the insulation piercing cable has a perimeter with two orthogonal axes of symmetry, and wherein the arrangement of conductors in said cross-section has point symmetry, and wherein said insulation piercing cable connector comprises a cavity for receiving said insulation piercing cable, wherein said cavity comprises three or more cable piercing conductors, wherein the amount of cable piercing conductors in the insulation piercing cable connector is the same as the amount of conductors in the insulation piercing cable, and wherein said insulation piercing cable connector is compatible to be electrically connected to said insulation piercing cable by piercing the insulation of said insulation piercing cable with said cable piercing conductors.

By using a flat cable with three or more conductors that has a combination of a cross-section (perpendicular to the longitudinal axis of the cable) having a perimeter with two orthogonal axes of symmetry and a point symmetrical arrangement of conductors in said cross-section it is possible to use a cable which may also be connected 'upside down' and is relatively easy to manufacture. The insulation piercing cable connection system of the invention can be used either in combination with direct current, or with alternating current.

The term "flat cable" as used herein is meant to refer to its commonly known meaning, i.e. a cable having a longitudinal cross-section of which the width is larger than the height. Hence, the aspect ratio (width divided by height) of the longitudinal cross-section of a flat cable is larger than 1.

The term "insulation piercing cable" as used herein is meant to refer to a cable that is suitable for insulation piercing contacts, viz. contacts that are realised by piercing the insulation of the cable and thereby electrically contacting the conductors comprised therein to external conductors.

The insulation piercing cable connection system of the invention may be connected to a single power circuit, such that at least the two outer cable piercing conductors in the insulation piercing cable connector are connected to each other and to a first external conductor, and an inner cable piercing conductors is connected to a second external conductor. It is also possible to have more than one inner cable piercing conductors, which may then be connected to each other and to the second external conductor.

The insulation piercing cable connection system of the invention may also be connected to two separate power circuits, such that at least the two outer cable piercing conductors in said insulation piercing cable connector are connected to two distinct inner cable piercing conductors via two separate external conductors, and wherein conductors of the insulation piercing cable connector are connected to each other and the power circuits.

In accordance with the invention, preferably direct current is used. This is unlike the OK5 micro inverter manufactured by NKF which makes use of alternating current (AC). A direct current bus voltage is advantageous, because an alternating current requires more complex converters electronics with an additional AC-output stage which requires more electronic components and therefore will be bigger, will have a higher manufacturing cost and lower reliability.

Additionally, the OK5 micro inverter manufactured by NKF makes use of Power Line Communication (PLC) over the two conductors of the flat cable which lead to reduced energy conversion efficiency due to losses in the PLC coupling components and the dissipation in the PLC circuit. The invention, on the other hand, uses additional conductors in the cable where, in the case of four conductors or more, PLC can be used without the energy consuming, expensive components that are required in the case of a conventional two conductor PLC.

In a solar power photovoltaic system, with local converters, the output of the local converters are typically connected by means of a bus cable (also called trunk cable). In such as system, the bus cable ideally operates at direct current (DC) instead of alternating current (AC). The advantages of DC over AC in this case is that the electronic circuitry in the converters can be kept simpler because an AC-output stage can be omitted. This means that less electronic components are necessary which reduces costs, size, dissipation, and increases the reliability of the converter. The use of DC instead of AC for the bus cable has additional advantages such as higher power transfer capability because the cable can be operated constantly at its maximum voltage, where in case of a sine wave AC voltage the effective (RMS) voltage is a factor 0.71 below the peak voltage.

Connection to a DC bus means that the conductors may not be swapped in contrast with connection to an AC bus where swapping of the conductors can be allowed. To make sure that a flat insulation piercing cable system cannot be connected the wrong way around, conventionally special shapes of the cross-section of such cables have been used, which special shapes only allow to electrically connect the cable in a single manner. Such a special cross-section is relatively expensive to manufacture and it prevents the possibility to twist the cable by 180 degrees at will, for instance to reduce the stress on the connection. The insulation piercing cable used in the insulation piercing cable connection system of the invention has three or more conductors and a cross-section having a perimeter with two orthogonal axes of symmetry and a point symmetrical arrangement of conductors in said cross-section. This allows for the cable to be installed in both ways (so also upside down), and in addition guarantees that the plus and minus conductors of the DC bus system are connected the right way. The insensitivity to the installation direction of the cable makes that the cable is attractive for manufacturing and allows twisting of the cable to prevent stress on the connections.

Communication with the converters used in a solar power (PV) system can be performed by means of wireless Radio Frequency (RF) communication. However, the specific characteristics of a solar power system integrated in a road surface hinder the operation of an RF communication link. Especially, the location of antennas close to the ground that can be wet results in undesirably high attenuation of the RF-link. The alternative for RF communication is power line communication (PLC) which is sometimes used for solar power converters. The drawback of conventional PLC is that it requires additional relatively expensive and energy consuming electronic components. The invention also provides for the possibility of using PLC but not in the traditional way over the power lines which means that considerably less energy is consumed and also less expensive components are necessary.

In a large scale solar power photovoltaic (PV) system, the individual solar panels can be connected in series. This string of in series connected panels is then connected to a grid connected central inverter which transforms the DC current from the PV panels to the AC current of the grid. This setup works well and is efficient when there is not too much hinder from shadows both from objects as well as from clouds. However, when shadows occur frequently performance degradation will result. This performance degradation can be limited when electronic converters are added at panel level which include Maximum Power Point Tracking (MPPT). Although it is possible to connect the output of these local converters in series, the preferred option is parallel connection to a 'bus' in combination with a relatively high output voltage. A further distinction can be made between direct current (DC) and alternating current (AC). AC may have the benefit that the output of the micro inverters can be connected directly to the grid, but for a large scale solar power system, in particular when combined with a road surface, the preference is to use a DC bus voltage.

The outputs of all the individual local converters have to be connected to the DC-bus. The stretched or lint shape of a solar power system, especially when integrated in a road surface, makes that the preferred interconnection method is the use of a bus-cable or trunk cable onto which all local converters are connected. This bus-cable with all of its connectors forms a considerable part of costs of the electric system resulting both from the material cost as well as from the labour related to preparation and installation. A considerable cost reduction can be obtained when the conventional connectors can be omitted. A known solution is the use of an insulation piercing connection system (also called insulation displacement connection), where an insulation piercing cable is pressed into a cavity of a insulation piercing cable connector which has a shape that corresponds with the shape of the cross-section of the cable. The insulation piercing connector further includes cable piercing conductors that pierce through the insulation of the cable and make contact with the conductors of the cable. A well-known implementation of this connection system is a two conductor cable which has a symmetrical rectangular shape, and which is used for outdoor lighting. Due to its symmetrical shape the cable can be connected in two ways which means that it is not known upfront which contact of the insulation piercing connector is connected to which conductor in the cable (FIG. 1). This does not have to be a problem in case of an AC application and can, for instance, be used to connect micro inverters with their AC outputs.

FIG. 1 shows such a conventional insulation piercing connection system with conductors 1 and 2, and a symmetric rectangular cross-section of cable 5 that can be used for AC application. The cable can be connected to insulation piercing cable connector 6 that has a shape that is complementary to the shape of cable 5. Connector 6 further includes cable piercing conductors 7 and 8 that pierce through the insulation cable 5 and make contact with conductors 1 and 2 of cable 5. In FIG. 1, polarity that can be applied is indicated by A and B. In case of an AC application, it is irrelevant whether the cable conductor with polarity A is connected to the cable piercing conductor with polarity A or B, and whether the cable conductor with polarity B is connected to the cable piercing conductor with polarity A or B. However, in case of a DC-bus voltage it has to be guaranteed that the plus and minus connections of the local converter are connected with the plus and minus of the DC-bus cable, respectively. With reference to FIG. 1, this means that the conductor with polarity A should be connected to the cable piercing conductor with polarity A and that the conductor with polarity B should be connected to the cable piercing conductor with polarity B. Incorrect electrical connection of the cable to the connector can be avoided by using a cable wherein the opposing lateral edges of a longitudinal cross-section have a different shape, such that the cable can only be connected to the connector in one way (not shown). Such cable will then not have a cross-section having a perimeter with two orthogonal axes of symmetry.

Instead, the insulation piercing cable connection system of the invention utilises an insulation piercing cable comprising a flat cable having three or more conductors embedded in insulation material, wherein a cross-section of the insulation piercing cable has a perimeter with two orthogonal axes of symmetry, and wherein the arrangement of conductors in said cross-section has point symmetry. Such a cable with preferably a rectangular (optionally rounded), cross-section, is easier to manufacture.

The insulation piercing cable connection system of the invention further utilises an insulation piercing cable connector in combination with the insulation piercing cable, comprising a cavity for receiving said insulation piercing cable, wherein said cavity comprises three or more cable piercing conductors, wherein the amount of cable piercing conductors in the insulation piercing cable connector is the same as the amount of conductors in the insulation piercing cable, and wherein the insulation piercing cable connector is compatible to be electrically connected to said insulation piercing cable by piercing the insulation of said insulation piercing cable with said cable piercing conductors. By piercing the insulation of the insulation piercing cable with the cable piercing conductors, the conductors in the insulation piercing cable connected are electrically connected (viz. are in electrical contact) to the respective conductors in the insulation piercing cable.

A schematic example of an embodiment of the invention is shown in FIG. 2. This figure shows an insulation piercing cable 5 with three conductors (1, 2 and 3). Cable 5 is to be connected to insulation piercing cable connector 6, which has three cable piercing conductors (7, 8 and 9). The two outer conductors (1 and 3) in insulation piercing cable 5 are used for the same polarity in FIG. 2 indicated with B. When insulation piercing cable 5 is connected to insulation piercing cable connector 6, conductors 1 and 3 will be connected to cable piercing conductors 7 and 9, which are used for the same polarity B. It does not matter in FIG. 2 whether conductor 1 will be connected to cable piercing conductor 7 and conductor 3 to cable piercing conductor 9, or whether conductor 1 will be connected to cable piercing conductor 9 and conductor 3 to cable piercing conductor 7. Conductor 2 will always be connected to cable piercing conductor 8. Hence, this configuration guarantees that contact-B of the insulation piercing cable connector is connected to contact-B on the insulation piercing cable side, and that contact-A of the insulation piercing cable connector is connected to contact-A on the insulation piercing cable side. It is not important whether the cable is inserted 'upside down' (herein also referred to as 'reversed'). The insulation piercing cable connection system shown in FIG. 2 can be used both for AC as well as DC applications. Inserting the cable upside down may be beneficial in certain cases to reduce the strain on the connections resulting from a twisted cable.

Preferably, the conductors in the flat cable may all be arranged in one plane. In a preferred embodiment, a cross-section of the insulation piercing cable has two orthogonal axes of symmetry. The centre of point symmetry is shown in FIG. 2 by an asterisk. Two axes of symmetry are shown for the embodiment in FIG. 2 by dotted lines.

It is preferred for the insulation piercing cable to comprise four or more conductors in a plane. Such a configuration provides the possibility for Power Line Communication (PLC) without efficiency reduction due to dissipation in the electronic components which is the case for conventional PLC, as will be explained herein below.

The insulation piercing cable connection system may be combined with a converter either with a DC-output or with an AC-output, preferably a converter with a DC-output.

Preferably, the amount of conductors in the insulation piercing cable is even. More preferably, the amount of the conductors used for different polarity in the insulation piercing cable is the same. Although it is possible to employ an uneven amount of conductors, this will automatically mean that there are more conductors of one polarity than there are conductors of the other polarity in the insulation piercing cable. In such an embodiment, the conductor cross-section (or conductor diameter) of the conductors with the polarity which is in the majority may optionally be reduced to balance the loading of the conductors for optimal use of the conductor material, although this will lead to higher manufacturing costs. Preferably, the conductor cross-section (or conductor diameter) of each conductor in the insulation piercing cable is the same.

The insulation piercing cable connector is compatible to be electrically connected with the insulation piercing cable of the invention. This means that the insulation piercing cable can be electrically connected to the connector such that the cable piercing conductors of the insulation piercing cable connector pierce through the insulation of the insulation piercing cable and each cable piercing conductor of the insulation piercing cable connector connects electrically to a different conductor in the insulation piercing cable.

Correct connection of contacts (viz. polarities) A and B can be guaranteed with any number of conductors with a minimum of three. In case of the three conductor configuration presented in FIG. 2, the current through contact B is distributed over two conductors in the cable, compared to only one conductor in the cable for contact A. This means that the conductor cross-section of the outer conductors used for contact B can be reduced to balance the loading of the conductors if necessary. This may yield a cost benefit. Another approach is to use a cable with an additional conductor. In FIG. 3, insulation piercing cable 5 has four conductors (1, 2, 3, and 4). Insulation piercing cable 5 is to be connected to insulation piercing cable connector 6, which has four cable piercing conductors (7, 8, 9, and 10). The centre of point symmetry is shown in FIG. 3 by an asterisk, and two axes of symmetry are shown with dotted lines. In this configuration, each contact A and B uses two conductors in parallel. The two outer conductors (1 and 4) in insulation piercing cable 5 are used for the same polarity, in FIG. 3 indicated with B. When insulation piercing cable 5 is connected to insulation piercing cable connector 6, conductors 1 and 4 will always be connected to cable piercing conductors 7 and 9, which are also used for polarity B. Conductors 2 and 3 will always be connected to cable piercing conductors 8 and 10. It does not matter in FIG. 3 whether conductor 1 will be connected to cable piercing conductor 7, conductor 2 to cable piercing conductor 8, conductor 3 to cable piercing conductor 10 and conductor 4 to cable piercing conductor 9, or whether conductor 1 will be connected to cable piercing conductor 9, conductor 2 to cable piercing conductor 10, conductor 3 to cable piercing conductor 8 and conductor 4 to cable piercing conductor 7. An additional benefit resulting from this approach is increased reliability due to the introduction of redundancy. If one contact or conductor breaks, the system will keep on operating due to the parallel connection. The insulation piercing cable connection system shown in FIG. 3 can be used both for AC as well as DC applications.

Figure 4:
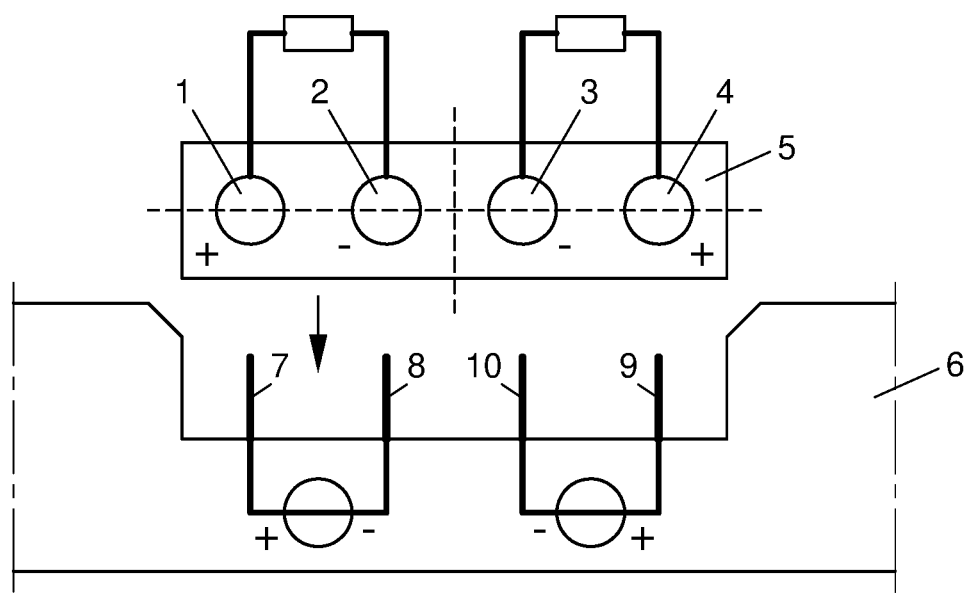
FIG. 4 depicts an insulation piercing cable with two separate power circuits.

When four conductors are available in the cable they can be interconnected to support only the two contacts A and B as illustrated in FIG. 3. It is, however, also possible to make a separation between two power circuits as illustrated in FIG. 4. In FIG. 4, insulation piercing cable 5 has four conductors (1, 2, 3, and 4). Cable 5 is to be connected to insulation piercing cable connector 6, which has four cable piercing conductors (7, 8, 9, and 10). The centre of point symmetry is shown in FIG. 4 by an asterisk, and two axes of symmetry are shown with dotted lines. The two outer conductors (1 and 4) in insulation piercing cable 5 are used for the same polarity. When insulation piercing cable 5 is connected to insulation piercing cable connector 6, conductors 1 and 4 will always be connected to cable piercing conductors 7 and 9, which are used for the same polarity (positive polarity in FIG. 4), but for different power circuits. Conductors 2 and 3 will always be connected to cable piercing conductors 8 and 10, which are used for the polarity opposite to that of the two outer cable piercing conductors 7 and 9 (negative polarity in FIG. 4), but for different power circuits. It does not matter in FIG. 4 whether conductor 1 will be connected to cable piercing conductor 7, conductor 2 to cable piercing conductor 8, conductor 3 to cable piercing conductor 10 and conductor 4 to cable piercing conductor 9, or whether conductor 1 will be connected to cable piercing conductor 9, conductor 2 to cable piercing conductor 10, conductor 3 to cable piercing conductor 8 and conductor 4 to cable piercing conductor 7. This configuration thus still allows the swapping of the cable (inserting upside down), when the polarity of the contacts is oriented to support this and the voltage of the two power circuits is compatible. Also this insulation piercing cable connection system shown in FIG. 4 can be used both for AC as well as DC applications.

The configuration with the two separate power circuits, as presented in FIG. 4, opens the possibility to combine the power transportation function of the bus-cable with a communication function. Communication between the local converters and a central unit can be attractive for multiple reasons. Messages from the local converters can contain information about the performance and error states. Messages in opposite direction from a central location to the local converters can be used to reduce the power output when requested or demanded by the grid operator to maintain the power quality on the grid. The local converters can also be instructed to shut down completely for safety reasons, for instance in case of an accident or a fire. When the bus cable is used for AC power transfer, the converters can also be instructed by the grid operator to generate reactive power to maintain the power quality on the grid.

Hence, in a special embodiment the insulation piercing cable comprises four conductors, wherein the four conductors are used for two separate power circuits.

Communication between a central unit and the local converters can be implemented by means of a wireless radio frequency (RF) link. However, the specific characteristics of a solar power system integrated in a road surface hinder the operation of an RF communication link. Especially the location of antennas close to the ground that can be wet result in high attenuation of the RF-link. The alternative for RF communication is power line communication (PLC) which is sometimes used for solar power converters. However, the drawback of conventional PLC is that it requires additional relative expensive and energy consuming electronic components. The multi conductor configuration presented in FIG. 4, however, provides the possibility to use PLC at a considerably lower power level thus consuming less energy which means less impact on the efficiency of the total system and less expensive electronic components necessary to implement PLC compared to a conventional PLC implementation.

Figure 5:
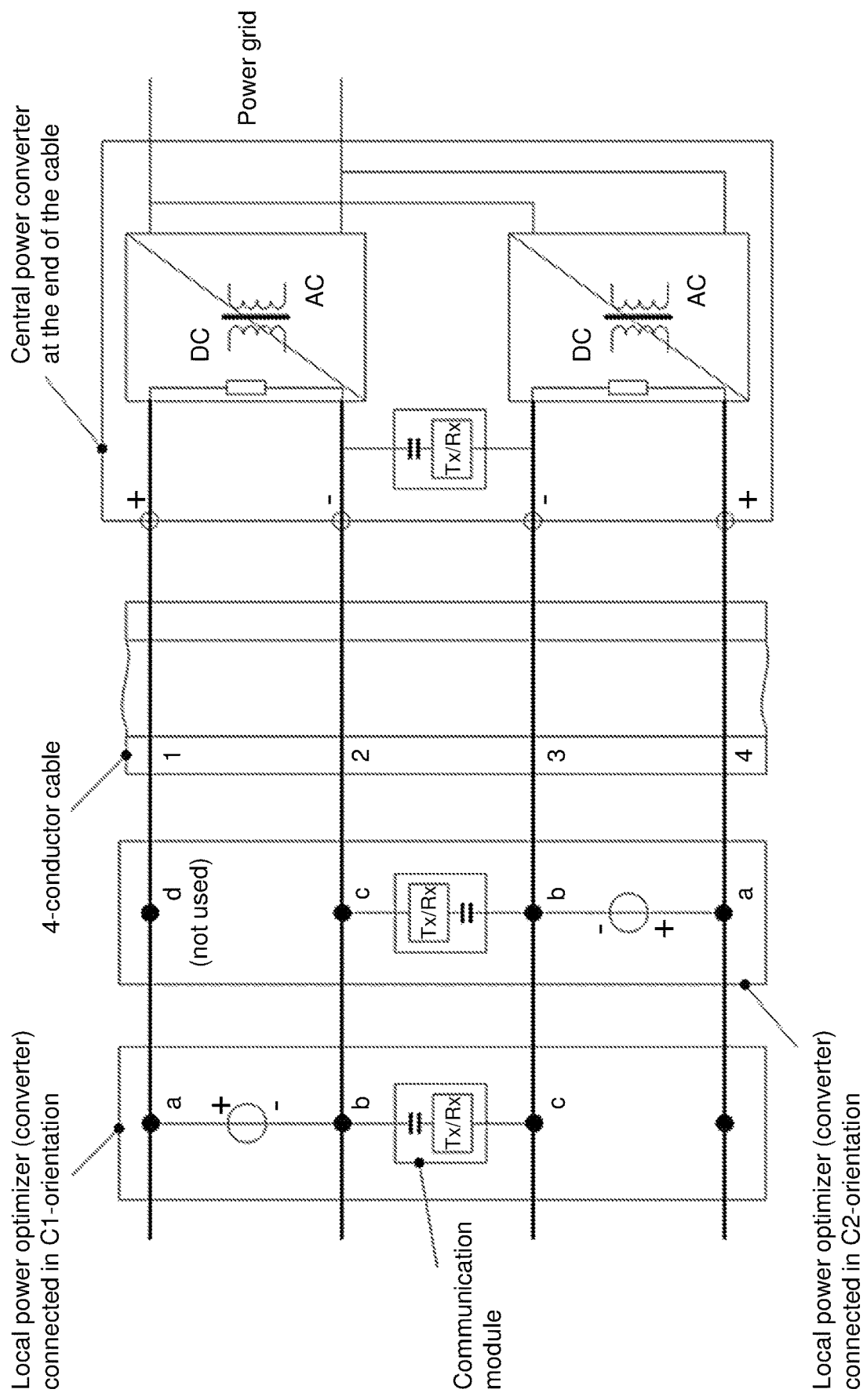
FIG. 5 depicts an electronic diagram wherein two local converters are connected in opposite ways to a four conductor bus cable.

FIG. 5 shows an electronic diagram wherein two local converters are connected in opposite ways to a four-conductor bus-cable. As illustrated in the electronic diagram shown in FIG. 5, the PLC communication modules are not connected between the power lines of a power circuit which is the conventional PLC implementation, but the communication module is now connected between the two separate power circuits. Hence, the insulation piercing cable connection system with four conductors that are used for two separate power circuits can be combined with power line communication, such that power line communication modules are connected between the two separate power circuits of the insulation piercing cable. When the communication module is connected in the traditional way, the communication module is loaded with the low impedance of the power converters connected to the same conductors. However, when the communication module is connected between the two power circuits, the loading is much lower which means that less power has to be put in the transmitter circuits to end up at a high enough signal level at the receivers for reliable communication. It is no problem that the two separate power circuits are interconnected behind the central power converters (inverters) because the galvanic isolation in these converters maintain the separation between the power circuits preventing 'shorting' of the communication modules. Parallel connection of the output of inverters is common practice and happens for instance when using multiple micro inverters. The multi conductor configuration is introduced to allow a reversed connection of the convertors as described above resulting from a 'upside down' connection of the insulation piercing cable. The resulting reversed connection of the communication modules as visible in FIG. 5 does not hinder the communication because the communication modules make use of an AC signal (carrier) that is coupled by means of capacitors.

In a further aspect, the invention is directed to a photovoltaic system, comprising one or more photovoltaic modules connected to one or more converters via one or more insulation piercing cable connection systems according to the invention.

The photovoltaic system is preferably integrated in a roadway surface to generate solar power.

In yet a further aspect, the invention is directed to a photovoltaic system, comprising one or more photovoltaic modules connected to one or more inventers via one or more insulation piercing cable connection systems according to the invention. When photovoltaic modules are integrated in applications such as in a roadway, the photovoltaic modules are individually connected to an inverter, amongst others for safety reasons. The circuit between the photovoltaic module and the inverters is a safety extra low voltage (SELV) circuit. This allows using an insulation piercing cable connection system according to the invention, instead of the conventional connection technology found in photovoltaic modules, such as MC4 (Multi-Contact 4 mm diameter).

Conventionally, the wires of a photovoltaic module are fixed to the junction box on the back of the module and have connectors to connect these to an inverter, or to the next modules, if placed in series. These connection systems are also developed for 1000 to 1500 V direct current (so not SELV) ratings.

The integration of photovoltaic modules in roadways leads to other connection demands as well. Ideally, a single photovoltaic module can be replaced, such as described in co-pending European patent application number 17194363.2. This is difficult if the wires cannot be disconnected at the junction box. On the other hand, the connection should also be disconnectable at the inverter, for installation ease. The use of an insulation piercing cable connection system as described herein, is very useful for such applications as well. Possible future monitoring devices may be installed, i.e. on a chip basis, in individual photovoltaic modules. This information can then also be transferred via the power line communication solution described earlier.

This connection concept was never an option for conventional photovoltaic modules because of the high voltage and current applied in a typical photovoltaic system. However, when integrated in roadway assemblies, it is possible to work with SELV levels on the module side, and the interconnection requirements are somewhat different. This allows to connect the photovoltaic modules to the inventers with an insulation piercing cable connection system of the invention.

Figure 6:
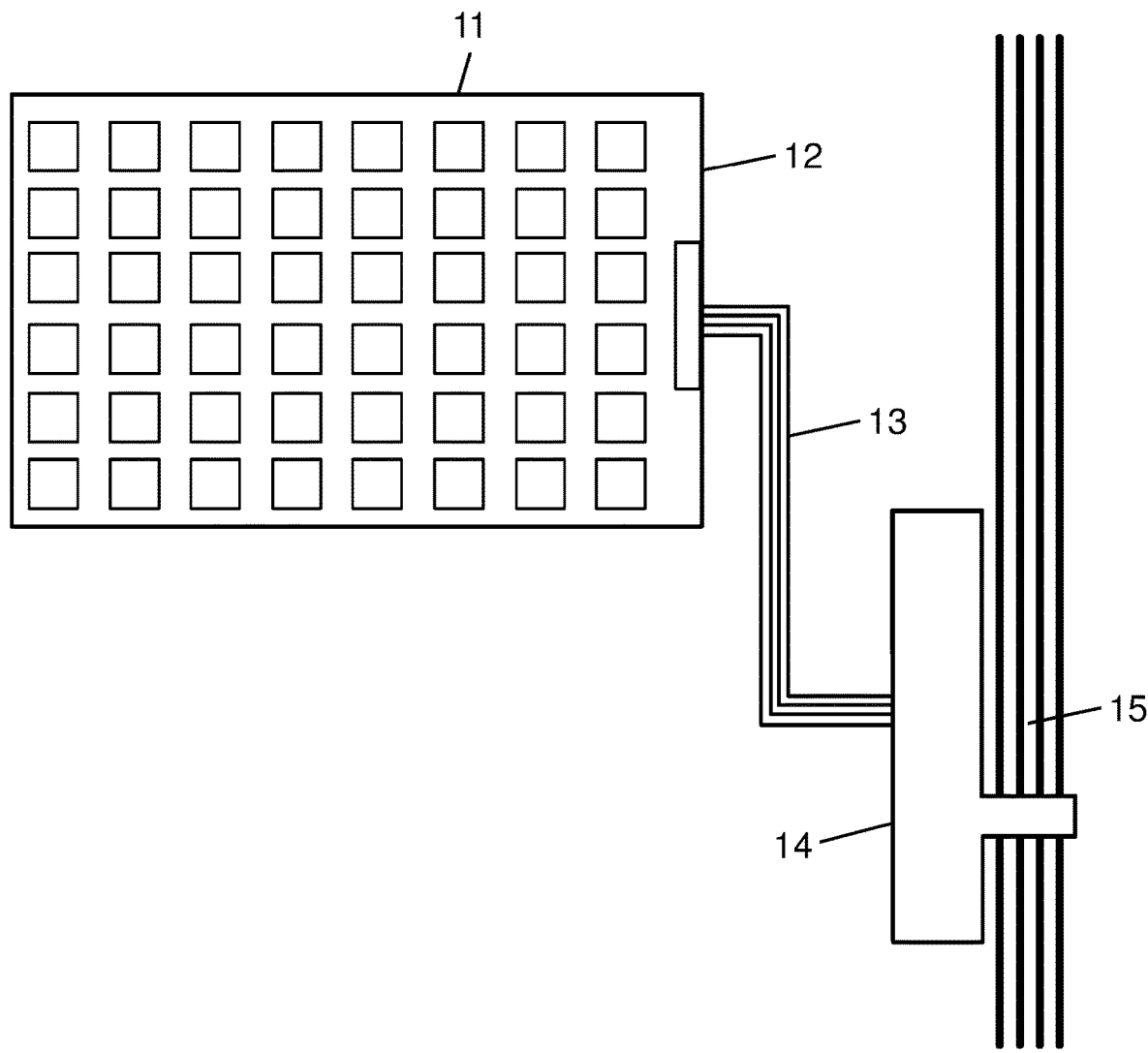
FIG. 6 depicts a photovoltaic module that has a junction box with an insulation piercing cable connector.

This is schematically shown in FIG. 6. This figure shows a photovoltaic module 11 that has a junction box 12 with an insulation piercing cable connector. Symmetrical insulation piercing cable 13 electrically connects photovoltaic module 11 to micro-inverter 14. Micro-inverter 14 has insulation piercing cable connectors such that it can be electrically connected to insulation piercing cable 13 and to bus-cable 15, which serves to transport the power to a central location. Bus-cable (or trunk cable) 15 is also an insulation piercing cable as described herein.

Accordingly, the photovoltaic system preferably comprises one or more photovoltaic modules connected to one or more inventers via one or more first insulation piercing cable connection systems according to the invention, as well as one or more second insulation piercing cable connection systems according to the invention that connect the one or more inverters to one or more converters.

The invention has been described by reference to various embodiments, compositions and methods. The skilled person understands that features of various embodiments, compositions and methods can be combined with each other.

All references cited herein are hereby completely incorporated by reference to the same extent as if each reference were individually and specifically indicated to be incorporated by reference and were set forth in its entirety herein.

The use of the terms "a" and "an" and "the" and similar referents in the context of describing the invention (especially in the context of the claims) are to be construed to cover both the singular and the plural, unless otherwise indicated herein or clearly contradicted by context. The terms "comprising", "having", "including" and "containing" are to be construed as open-ended terms (i.e., meaning "including, but not limited to") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. For the purpose of the description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

Preferred embodiments of this invention are described herein. Variation of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject-matter recited in the claims appended hereto as permitted by applicable law. Moreover, any combination of the above-described elements in all possible variations thereof is encompassed by the invention unless otherwise indicated herein or otherwise clearly contradicted by context. The claims are to be construed to include alternative embodiments to the extent permitted by the prior art.

For the purpose of clarity and a concise description features are described herein as part of the same or separate embodiments, however, it will be appreciated that the scope of the invention may include embodiments having combinations of all or some of the features described.

The invention claimed is:

1. An insulation piercing cable connection system, comprising an insulation piercing cable, and an insulation piercing cable connector,
    wherein said insulation piercing cable comprises a flat cable having a plurality of three or more conductors embedded in insulation material,
    wherein a cross-section of the insulation piercing cable has a perimeter with two orthogonal axes of symmetry,
    wherein the conductors as arranged in said cross-section have point symmetry,
    wherein said insulation piercing cable connector comprises a cavity for receiving said insulation piercing cable,
    wherein said cavity comprises a plurality of three or more cable piercing conductors,
    wherein the plurality of cable piercing conductors in the insulation piercing cable connector is equal to the plurality of conductors in the insulation piercing cable, and
    wherein said insulation piercing cable connector is compatible to be electrically connected to said insulation piercing cable by piercing the insulation of said insulation piercing cable with said cable piercing conductors.

2. The insulation piercing cable connection system according to claim 1, connected to a single power circuit, wherein at least two outer cable piercing conductors in said insulation piercing cable connector are connected to each other and to a first external conductor, and one or more inner cable piercing conductors are connected to each other and to a second external conductor.

3. The insulation piercing cable connection system according to claim 1, connected to two separate power circuits, wherein at least two outer cable piercing conductors in said insulation piercing cable connector are connected to two distinct inner cable piercing conductors via two separate external conductors, and wherein conductors of the insulation piercing cable connector are connected to each other and the power circuits.

4. The insulation piercing cable connection system according to claim 3, wherein said insulation piercing cable comprises four conductors and wherein the four conductors are used for two separate power circuits.

5. The insulation piercing cable connection system according to claim 3, combined with power line communication, wherein one or more power line communication modules are connected between the said two separate power circuits of the insulation piercing cable.

6. The insulation piercing cable connection system according to claim 1, wherein the perimeter of said cross-section has a rectangular shape.

7. The insulation piercing cable connection system according to claim 6, wherein said rectangular shape is rounded.

8. The insulation piercing cable connection system according to claim 1, wherein said insulation piercing cable comprises four or more conductors in a plane.

9. The insulation piercing cable connection system according to claim 1, wherein the plurality of conductors in the insulation piercing cable is even.

10. The insulation piercing cable connection system according to claim 1, wherein said insulation piercing cable comprises a polarity indication for each of said three or more conductors comprised in said cable, and wherein the indication is such that in a cross-section of said cable, an arrangement of polarities as indicated by the polarity indication have point symmetry.

11. The insulation piercing cable connection system according to claim 1, in combination with a converter with a DC-output.

12. The insulation piercing cable connection system according to claim 1, in combination with a converter with an AC-output.

13. A photovoltaic system, comprising one or more photovoltaic modules connected to one or more converters via one or more insulation piercing cable connection systems according to claim 1.

14. A photovoltaic system, comprising one or more photovoltaic modules connected to one or more inverters via one or more insulation piercing cable connection systems according to claim 1.

15. The photovoltaic system according to claim 14, wherein the one or more inverters are further connected to one or more converters via one or more insulation piercing cable connection systems.

* * * * *